July 3, 1951 B. KULHAVY 2,559,019

SANITARY CLOSET BASIN

Filed Oct. 17, 1949

Inventor

Bedrich Kulhavy

Patented July 3, 1951

2,559,019

UNITED STATES PATENT OFFICE 2,559,019

SANITARY CLOSET BASIN

Bedřich Kulhavý, Revuca, Kupele, Czechoslovakia

Application October 17, 1949, Serial No. 121,655
In Czechoslovakia November 8, 1948

5 Claims. (Cl. 4—10)

Figures 1, 2, 3, 4, 5, 6, 7, 8:
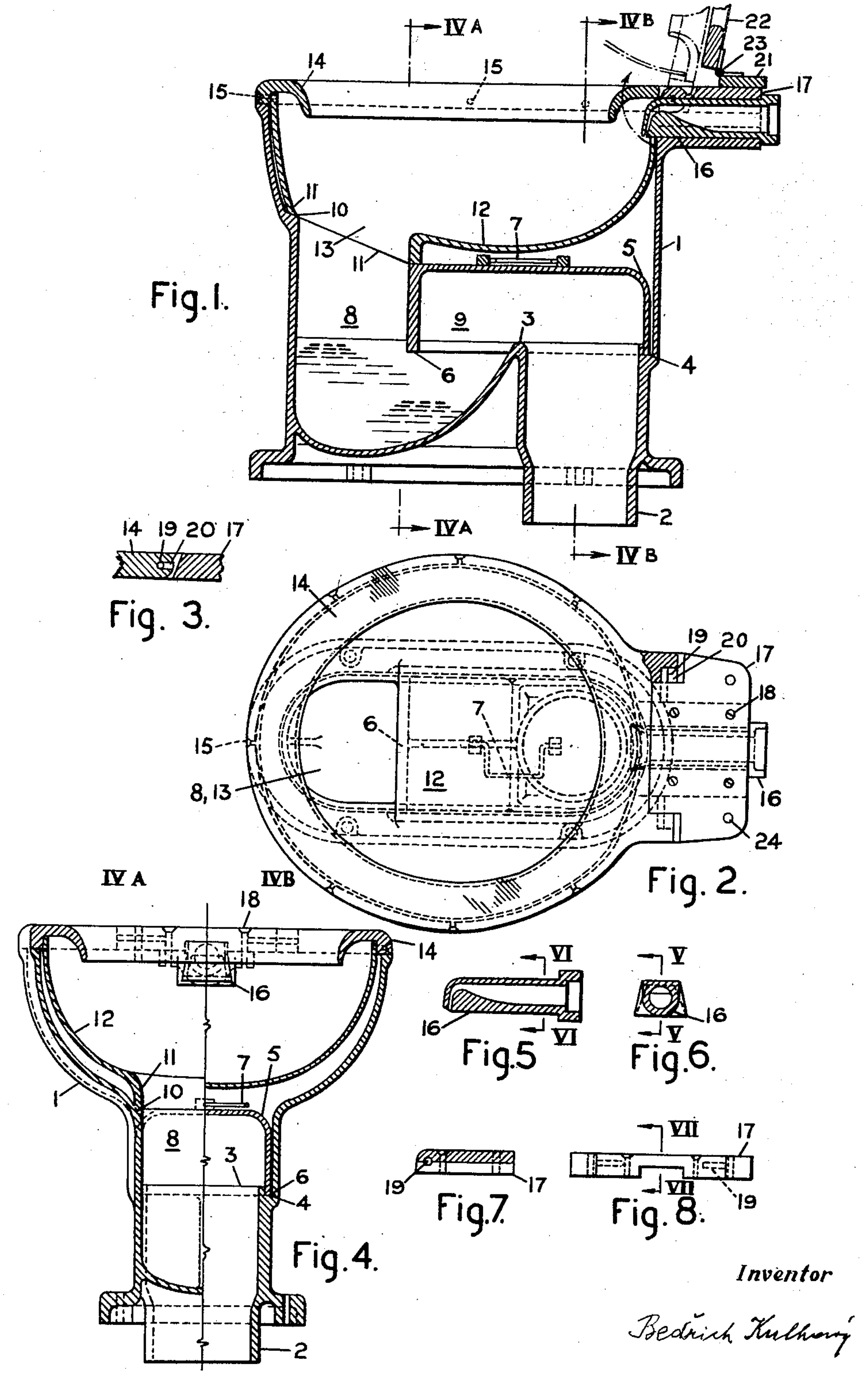

This invention relates to sanitary closet basins, and one object of the invention is to provide an improved basin which facilitates cleansing and clearing operations.

According to the invention a sanitary closet basin is provided with an outer shell, a removable inner bowl, and a removable bell which fits inside the shell, the bell and the shell being mutually complementary so as to form a discharge siphon and a water-trap. Preferably part of the wall of the bell is arranged to provide inlet and discharge ports for the water-trap. In an advantageous construction the shell comprises a discharge conduit and part of the lower edge of the bell fits around part of the upper end of the discharge conduit. The above-mentioned features and further features of the invention are to be perceived by studying the following description of a basin according to the invention and the following claims.

In the accompanying drawings one sanitary closet basin according to the invention is illustrated by way of example, Figure 1 being a sectional side elevation of the basin, Figure 2 a plan view of the basin, Figure 3 a sectional view of a detail, Figure 4 a front sectional elevation of the basin, the section being taken half on the line IVA—IVA and half on the line IVB—IVB of Figure 1, Figures 5 and 6 sectional views of the flushing nozzle, and Figures 7 and 8 a sectional view and front elevation respectively of a cover plate.

Referring to the said drawings, the basin comprises an outer shell 1 which is formed as a pedestal. A discharge conduit 2 is formed integrally with the shell 1 and has an upper edge 3 located so that water is trapped in the lower part of the shell 1. Around part of the upper end of the conduit 2 there is formed a seat 4 on which rests a bell 5 having a lower edge 6 in contact with the seat 4. A pivoted handle 7 is provided on top of the bell 5. One wall of the bell 5 extends downwardly and thereby provides an inlet port 8 and a discharge port 9 for the water-trap. The bell 5 and the conduit 2 together form a discharge siphon. A removable inner bowl 12 is arranged within the shell 1 and has its lower edge 11 resting on an internal ledge 10 in the shell. The bowl 12 has a discharge opening 13 which corresponds with the inlet port 8 of the water-trap. A supporting rim 14 is secured by bolts 15 to the upper edge of the bowl 12. Through an aperture at the rear of the bowl 12 projects a flushing nozzle 16 which is secured in its place on the shell 1 by means of a cover plate 17 which is fixed to the shell 1 by bolts 18. Two trunnions 19 are provided on the plate 17 and in the rear parts of the bowl 12 are slots 20 to accommodate these trunnions. A seat 22 is connected by a hinge 23 to a plate 21 which is fixed by screws 24 to the plate 17.

From the above description it will be clear that the inner bowl 12 together with the supporting rim 14 can be swung upwardly about the journals or trunnions 19 to assume a position which is partly indicated by dotted lines in Figure 1. By means of the handle 7 the bell 5 may be lifted out, and then all the surfaces of the shell, the bowl and the bell are accessible for cleaning. The interior of the conduit 2 is also accessible, and this facilitates clearing the conduit or the pipe below it should anything become lodged therein. The slots 20 permit the bowl 12 to be lifted off the trunnions 19. A further advantage is that if the bowl or the bell become damaged or defective it is easy to remove them and to insert a replacement.

Various modifications may be introduced without departing from the invention as claimed below, for example the inner bowl and the supporting rim may be formed integrally with each other.

What I claim is:

1. A sanitary closet basin comprising an outer shell, a removable bowl fitting inside said shell, and a removable bell fitting inside said shell below said bowl, said shell and said bell being mutually complementary and forming a discharge siphon and a water-trap, said bell having a wall dividing the inlet side from the discharge side of said water-trap, and a discharge conduit integral with said shell, and part of the lower edge of said bell fitting around part of the upper end of said discharge conduit, and a plate secured to said shell, pivots on said plate, and slots in said bowl to accommodate said pivots enabling said bowl to be swung around said pivots.

2. A sanitary closet basin comprising an outer shell, a removable bowl fitting inside said shell, and a removable bell fitting inside said shell below said bowl, said shell and said bell being mutually complementary and forming a discharge siphon and a water-trap, said bell having a wall dividing the inlet side from the discharge side of said water-trap, and a discharge conduit integral with said shell, and part of the lower edge of said bell fitting around part of the upper end of said discharge conduit, and a plate secured to said shell, pivots on said plate, and slots in said bowl to accommodate said pivots enabling said bowl to be swung around said pivots, and a supporting rim secured to said bowl.

3. A sanitary closet basin comprising an outer shell, a removable bowl fitting inside said shell, and a removable bell fitting inside said shell below said bowl, said shell and said bell being mutually complementary and forming a discharge siphon and a water-trap, said bell having a wall dividing the inlet side from the discharge side of said water-trap, and a discharge conduit integral with said shell, and part of the lower edge of said bell fitting around part of the upper end of said discharge conduit, and a plate secured to said shell, pivots on said plate, and slots in said bowl to accommodate said pivots, enabling said bowl to be swung around said pivots, and a detachable flushing nozzle held in position by said plate.

4. A sanitary closet basin comprising an outer shell, a removable bowl fitting inside said shell, and a removable bell fitting inside said shell below said bowl, said shell and said bell being mutually complementary and forming a discharge siphon and a water-trap, said bell having a wall dividing the inlet side from the discharge side of said water-trap, and a discharge conduit integral with said shell, and part of the lower edge of said bell fitting around part of the upper end of said discharge conduit, an internal ledge formed in said shell and the lower edge of said bowl fitting partly against said ledge and partly against the top of said bell.

5. In a sanitary closet basin the combination of an outer shell formed as a pedestal and with a discharge port and a well, a removable bell inside said shell fitting partly around said port and having a dependant wall extending into water in said well and forming in conjunction with said shell a water-trap and a discharge siphon, a removable inner bowl fitting inside said shell above said bell, a supporting rim secured to said bowl and engaging the upper edge of said shell, a detachable plate secured to said shell, a removable flushing nozzle held in position by said plate, co-operating pivot means on said plate and said bowl and permitting said bowl to be swung up to cleaning position and down to operative position, and a seat hingedly connected to said plate.

BEDŘICH KULHAVÝ.

REFERENCES CITED

The following references are of record in the file of this patent:

UNITED STATES PATENTS

| Number | Name | Date |
|---|---|---|
| 190,767 | Keyser | May 15, 1877 |
| 202,193 | Reid | Apr. 9, 1878 |
| 285,925 | Putnam | Oct. 2, 1883 |
| 1,335,095 | De Guenther | Mar. 30, 1920 |